(12) United States Patent
Kawabata et al.

(10) Patent No.: US 9,953,932 B2
(45) Date of Patent: Apr. 24, 2018

(54) ELECTRONIC CIRCUIT PACKAGE

(71) Applicant: TDK Corporation, Tokyo (JP)

(72) Inventors: Kenichi Kawabata, Tokyo (JP); Toshio Hayakawa, Tokyo (JP); Toshiro Okubo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/465,177

(22) Filed: Mar. 21, 2017

(65) Prior Publication Data

US 2017/0301628 A1    Oct. 19, 2017

(30) Foreign Application Priority Data

Mar. 23, 2016   (JP) .................. 2016-058731

(51) Int. Cl.
  *H01L 23/552*   (2006.01)
  *H01L 23/31*    (2006.01)
  (Continued)

(52) U.S. Cl.
  CPC ...... *H01L 23/552* (2013.01); *H01L 21/32051* (2013.01); *H01L 21/565* (2013.01); *H01L 21/78* (2013.01); *H01L 23/3121* (2013.01); *H01L 23/49838* (2013.01); *H01L 24/16* (2013.01); *H01L 24/97* (2013.01); *H01L 23/49822* (2013.01); *H01L 23/49827* (2013.01); *H01L 2224/16227* (2013.01); *H01L 2924/0103* (2013.01); *H01L 2924/01012* (2013.01); *H01L 2924/01013* (2013.01); *H01L 2924/01014* (2013.01); *H01L 2924/01022* (2013.01); *H01L 2924/01024* (2013.01); *H01L 2924/01025* (2013.01); *H01L 2924/01026* (2013.01); *H01L 2924/01027* (2013.01); *H01L 2924/01028* (2013.01); *H01L 2924/01029* (2013.01); *H01L 2924/0132* (2013.01);
(Continued)

(58) Field of Classification Search
  CPC ....... H01L 23/552; H01L 24/97; H01L 21/78; H01L 23/3121; H01L 23/49838; H01L 24/16; H01L 21/565; H01L 21/32051
  USPC ........................................... 257/659
  See application file for complete search history.

(56) References Cited

U.S. PATENT DOCUMENTS 6,333,552 B1   12/2001  Kakimoto et al.
8,766,429 B2 *  7/2014  Kim ...................... H01L 23/552
                                                      257/659
(Continued)

FOREIGN PATENT DOCUMENTS

JP   H935927 A    2/1997
JP   H10241925 A  9/1998
(Continued)

*Primary Examiner* — Luan C Thai
(74) *Attorney, Agent, or Firm* — Young Law Firm, P.C.

(57) ABSTRACT

Disclosed herein is an electronic circuit package includes: a substrate having a power supply pattern; an electronic component mounted on a surface of the substrate; a mold resin covering the surface of the substrate so as to embed therein the electronic component; a laminated structure of a magnetic film and a metal film, the laminated structure covering at least an upper surface of the molding resin. The metal film is connected to the power supply pattern, and a resistance value at an interface between the magnetic film and the metal film is equal to or larger than $10^6 \Omega$.

9 Claims, 24 Drawing Sheets

(51) Int. Cl.
    *H01L 23/00*         (2006.01)
    *H01L 23/498*       (2006.01)
    *H01L 21/56*         (2006.01)
    *H01L 21/78*         (2006.01)
    *H01L 21/3205*      (2006.01)

(52) U.S. Cl.
    CPC ............... *H01L 2924/0133* (2013.01); *H01L 2924/01047* (2013.01); *H01L 2924/01079* (2013.01); *H01L 2924/05442* (2013.01); *H01L 2924/19041* (2013.01); *H01L 2924/19042* (2013.01); *H01L 2924/19105* (2013.01); *H01L 2924/3025* (2013.01)

(56) References Cited

U.S. PATENT DOCUMENTS

| | | | |
|---|---|---|---|
| 9,269,673 B1 * | 2/2016 | Lin | H01L 24/97 |
| 9,362,196 B2 * | 6/2016 | Yamada | H01L 23/3128 |
| 9,461,001 B1 * | 10/2016 | Tsai | H01L 23/552 |
| 9,490,221 B2 * | 11/2016 | Arai | H01L 23/552 |
| 2011/0304015 A1 | 12/2011 | Kim et al. | |
| 2013/0214396 A1 | 8/2013 | Kim | |
| 2015/0035127 A1 | 2/2015 | Yang et al. | |

FOREIGN PATENT DOCUMENTS

| | | |
|---|---|---|
| JP | 200058691 A | 2/2000 |
| JP | 200619342 A | 1/2006 |
| JP | 2009218484 A | 9/2009 |
| JP | 2010-087058 A | 4/2010 |
| JP | 2011077430 A | 4/2011 |
| JP | 2011249628 A | 12/2011 |
| WO | 2006059771 A1 | 6/2006 |

\* cited by examiner

ELECTRONIC CIRCUIT PACKAGE

BACKGROUND OF THE INVENTION

Field of the Invention

The present invention relates to an electronic circuit package and, more particularly, to an electronic circuit package provided with a composite shielding function having both an electromagnetic shielding function and a magnetic shielding function.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

In order to realize the higher shielding characteristics, a composite shielding structure, which has both an electromagnetic shielding function and a magnetic shielding function, is proposed in recent years. In order to realize the composite shielding structure, it is necessary to form, in an electronic circuit package, an electromagnetic shielding by a conductive film (metal film) and a magnetic shielding by a magnetic film.

For example, an electronic circuit module described in JP 2010-087058A has a configuration in which a metal film and a magnetic layer are laminated in this order on a surface of a mold resin. Further, a semiconductor package described in U.S. Patent Publication No. 2011/0304015 has a configuration in which a shield case (shield can) obtained by laminating a magnetic layer and a metal film is bonded to a mold resin by an adhesive.

However, in the electronic circuit packages described in JP 2010-087058A and U.S. Patent Application Publication No. 2011/0304015, in case that electromagnetic wave noise enters a metal film to generate an eddy current, the eddy current flows in a magnetic film to degrade magnetic characteristics of the magnetic film.

SUMMARY

The object of the present invention is therefore to provide an electronic circuit package having a composite shielding structure of both magnetic shielding function achieved by a magnetic film and electromagnetic shielding function by a metal film, capable of preventing degradation in magnetic characteristics of the magnetic film due to an eddy current.

An electronic circuit package according to the present invention includes: a substrate having a power supply pattern; an electronic component mounted on a front surface of the substrate; a molding resin that covers the front surface of the substrate so as to embed the electronic component therein; and a laminated structure of a magnetic film and a metal film, the laminated structure covering at least an upper surface of the molding resin. The metal film is connected to the power supply pattern, and a resistance value at the interface between the magnetic film and the metal film is equal to or larger than $10^6 \Omega$.

According to the present invention, the resistance value at the interface between the magnetic film and the metal film is equal to or larger than $10^6 \Omega$, so that an eddy current generated by electromagnetic wave noise entering the metal film hardly flows in the magnetic film. Therefore, it becomes possible to prevent degradation in magnetic characteristics of the magnetic film due to inflow of the eddy current.

In the present invention, the laminated structure preferably covers also a side surface of the molding resin. This can enhance composite shielding characteristics in the side surface direction.

In the present invention, the laminated structure preferably includes an insulating material interposed between the magnetic film and the metal film. With this configuration, even if a material having a comparatively low resistance value is used as the material of the magnetic film, the resistance value at the interface between the magnetic film and the metal film can be made equal to or larger than $10^6 \Omega$.

In the present invention, the laminated structure is formed such that the magnetic film is positioned on the molding resin side. With this configuration, higher composite shielding characteristics can be obtained. However, the laminated structure may be formed such that the metal film is positioned on the molding resin side.

In the present invention, the magnetic film may be a film formed of a composite magnetic material in which magnetic fillers are dispersed in a thermosetting resin material, or a thin film or a foil formed of a soft magnetic material, or a thin film, a bulk sheet, or a foil formed of a ferrite and the like. When the film formed of a composite magnetic material is used, the magnetic filler is preferably formed of a ferrite or a soft magnetic metal, and a surface of the magnetic filler is preferably insulation-coated.

Preferably, in the present invention, the metal film is mainly composed of at least one metal selected from a group consisting of Au, Ag, Cu, and Al, and more preferably, the surface of the metal film is covered with an antioxidant film.

In the present invention, it is preferable that the power supply pattern is exposed to a side surface of the substrate and that the metal film contacts the exposed power supply pattern. With this configuration, it is possible to easily and reliably connect the metal film to the power supply pattern.

As described above, according to the present invention, it is possible to prevent degradation in magnetic characteristics of the magnetic film due to an eddy current while ensuring high composite shielding effect.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
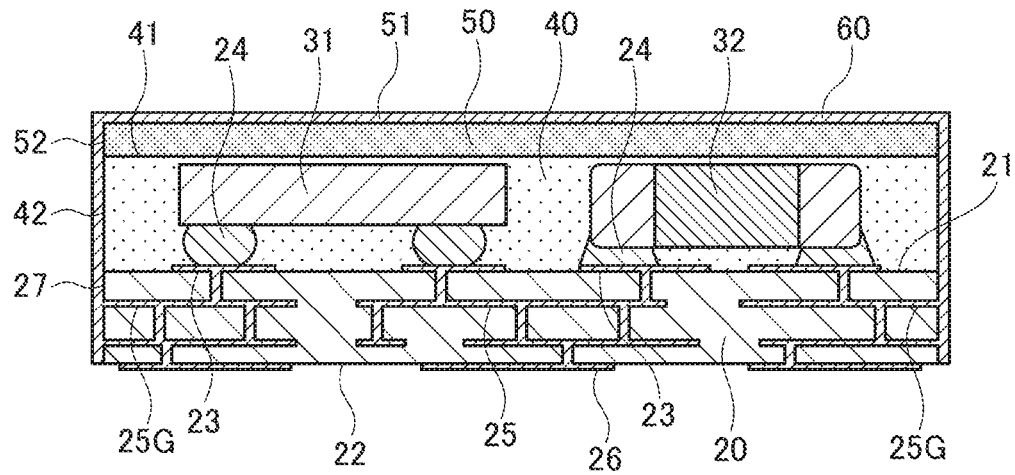
FIG. 1 is a cross-sectional view illustrating a configuration of an electronic circuit package according to a first embodiment of the present invention.

FIG. 1 is a cross-sectional view illustrating a configuration of an electronic circuit package 11A according to the first embodiment of the present invention.

As illustrated in FIG. 1, the electronic circuit package 11A according to the present embodiment includes a substrate 20, a plurality of electronic components 31 and 32 mounted on the substrate 20, a mold resin 40 covering a front surface 21 of the substrate 20 so as to embed the electronic components 31 and 32, a magnetic film 50 covering the mold resin 40, and a metal film 60 covering the mold resin 40 and the magnetic film.

Although the type of the electronic circuit package 11A according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester, a phenol, or an imide; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 of the substrate 20 and wiring layers of two layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and/or conductivity. Methods such as printing, plating, foil lamination, sputtering, vapor deposition, and inkjet can be used to form the above conductive materials.

The internal wirings 25 to which G is added at the end of its sign in FIG. 1 are power supply patterns. The power supply patterns 25G are typically ground patterns to which a ground potential is to be applied; however, it is not limited to the ground patterns as long as the power supply patterns 25G area pattern to which a fixed potential is to be applied.

The mold resin 40 covers the surface 21 of the substrate 20 so as to embed therein the electronic components 31 and 32. In the present embodiment, a side surface 42 of the mold resin 40 and a side surface 27 of the substrate 20 form the same plane. As a material for the mold resin 40, a material based on a thermosetting material or a thermoplastic material and blended with fillers for adjusting a thermal expansion coefficient can be used.

A top surface 41 of the mold resin 40 is covered with the magnetic film 50. Although not particularly limited, it is preferable that the mold resin 40 and magnetic film 50 directly contact each other without intervention of an adhesive or the like. The magnetic film 50 may be a film formed of a composite magnetic material in which magnetic fillers are dispersed in a thermosetting resin material, a thin film formed of a soft magnetic material or a ferrite, or a foil or a bulk sheet and serves as a magnetic shield.

In case that the film formed of a composite magnetic material is selected as the magnetic film 50, an epoxy resin, a phenol resin, a silicone resin, a diallyl phthalate resin, a polyimide resin, an urethane resin, and the like may be used as the thermosetting resin material, and the magnetic film 50 can be formed by using a thick-film formation method such as a printing method, a molding method, a slit nozzle coating method, a spray method, a dispensing method, an injection method, a transfer method, a compression molding method, or a lamination method using an uncured sheet-like resin. Using the thermosetting resin material, reliability required for electronic circuit packages such as heat resistance, insulation performance, impact resistance, falling resistance, and the like can be enhanced.

As the magnetic filler, a ferrite or a soft magnetic metal is preferably used, and a soft magnetic metal having a high bulk permeability is more preferably used. As the ferrite or soft magnetic metal, one or two or more metals selected from a group consisting of Fe, Ni, Zn, Mn, Co, Cr, Mg, Al, and Si and oxides thereof may be exemplified. As specific examples, a ferrite such as Ni—Zn ferrite, Mn—Zn ferrite, Ni—Cu—Zn ferrite, a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, an Fe—Ni—Co alloy, and Fe, and the like may be exemplified. The shape of the magnetic filler is not especially limited; however, it may be formed into a spherical shape for a high filling level, and fillers having a plurality of particle size distribution may be blended or combined for a densest filling structure. In order to maximize a shield effect by a permeability real component and a thermal conversion effect of a loss by a permeability imaginary component, it is more preferable to form by making flat powder having an aspect ratio of 5 or more orientate.

It is preferable that the surface of the magnetic filler is insulation-coated by an oxide of a metal such as Si, Al, Ti, or Mg, or an organic material for enhancing fluidity, adhesion, and insulation performance. For the insulation coating, an oxide film may be formed by coating a thermosetting material on the surface of the magnetic filler or dehydration reaction of a metal alkoxide, formation of a silicon oxide coating film is most preferable. It is more preferable to apply an organofunctional coupling treatment on the formed coating film.

The composite magnetic material can be formed on the top surface 41 of the mold resin using a known method such as a printing method, a molding method, a slit nozzle coating method, a spray method, a dispensing method, or a lamination method using an uncured sheet-like resin.

In case that the thin film formed of a soft magnetic material or a ferrite is selected as the magnetic film 50, one or two or more metals selected from a group consisting of Fe, Ni, Zn, Mn, Co, Cr, Mg, Al, and Si and oxides thereof may be used. In this case, the magnetic film 50 can be formed on the top surface 41 of the mold resin 40 by using a plating method, a spray method, an AD method, and a thermal spraying method, as well as a thin-film formation method such as a sputtering method or a vapor-deposition method. In this case, the material for the magnetic film 50 may be appropriately selected based on a required permeability and frequency; however, in order to enhance a shield effect on a lower frequency side (kHz to 100 MHz), an alloy of Fe—Co, Fe—Ni, Fe—Al, or Fe—Si is most preferably used. On the other hand, in order to enhance a shield effect on a higher frequency side (50 to several hundreds of MHz), a ferrite film formed of NiZn, MnZn, or NiCuZn, or Fe is most preferably used.

In case that a foil or a bulk sheet is used as the magnetic film 50, it becomes possible to directly form the magnetic film 50 consisting of a foil or a bulk sheet on the top surface 41 of the mold resin 40 by previously setting the foil or bulk sheet in a mold for forming the mold resin 40.

The top surface 51 and side surface 52 of the magnetic film 50, the side surface 42 of the mold resin 40, and the side surface 27 of the substrate 20 are covered with the metal film 60. The metal film 60 serves as an electromagnetic shielding and is preferably mainly composed of at least one metal selected from a group consisting of Au, Ag, Cu, and Al. The metal film 60 preferably has a resistance as low as possible and it is most preferable to use Cu in terms of cost and the like. An outer surface of the metal film 60 is preferably covered with an anticorrosive metal such as SUS, Ni, Cr, Ti, or brass or an antioxidant coating made of a resin such as an epoxy, a phenol, an imide, an urethane, or a silicone. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As illustrated in FIG. 1, the power supply patterns 25G are exposed to the side surface 27 of the substrate 20. The metal film 60 is connected to the power supply pattern 25G by covering the side surface 27 of the substrate 20.

The resistance value at an interface between the metal film 60 and the magnetic film 50 is equal to or larger than $10^6\Omega$. Thus, it becomes possible to prevent deterioration in the magnetic characteristics of the magnetic film 50 due to inflow of an eddy current because the eddy current generated by electromagnetic wave noise entering the metal film 60 hardly flows in the magnetic film 50. The resistance value at the interface between the metal film 60 and the magnetic film 50 refers to a surface resistance of the magnetic film 50 when the metal film 60 and magnetic film 50 directly contact each other and to a surface resistance of an insulating film when the insulating film is present between the metal film 60 and the magnetic film 50. The resistance value at the interface between the metal film 60 and magnetic film 50 is preferably equal to or larger than $10^6\Omega$ over the entire area of the interface; however, it does not matter if the resistance value is partially smaller than $10^6\Omega$.

Figure 2:
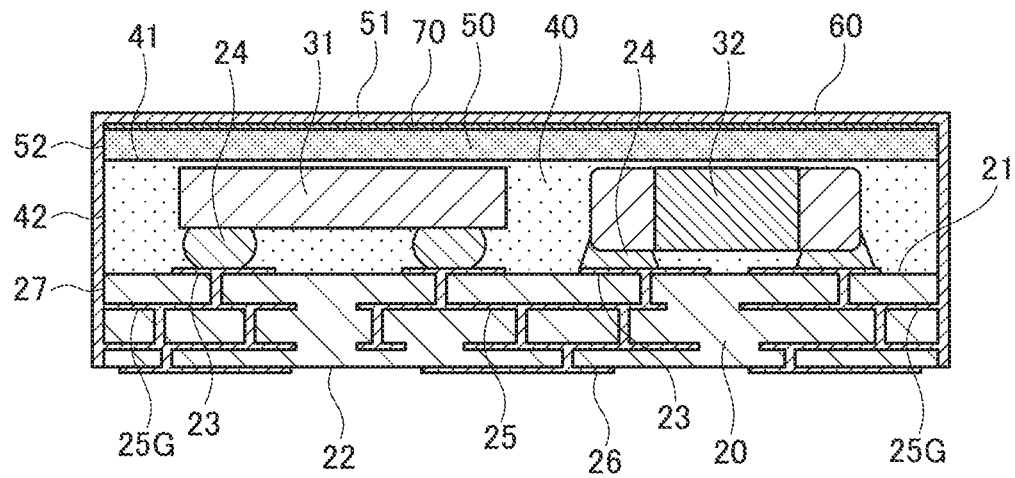
FIG. 2 is a cross-sectional view illustrating a configuration of an electronic circuit package according to a modification of the first embodiment.

As methods in order to make a resistance value at an interface between the metal film 60 and the magnetic film 50 equal to or higher than $10^6\Omega$, a method using a material having a sufficiently high surface resistance as the material for the magnetic film 50 or a method forming a thin insulating material on the top surface 51 of the magnetic film 50 are exemplified. FIG. 2 is a cross-sectional view illustrating a configuration of an electronic circuit package 11B according to a modification. The electronic circuit package 11B differs from the electronic circuit package 11A shown in FIG. 1 in that a thin insulating film 70 is interposed between the magnetic film 50 and the metal film 60. By interposing the insulating film 70, it becomes possible to make a resistance value at an interface between the metal film 60 and the magnetic film 50 equal to or higher than $10^6\Omega$ even when a material having a comparatively low resistance value is used as the material for the magnetic film 50, thereby making it possible to prevent deterioration in magnetic characteristics due to an eddy current.

As described above, in the electronic circuit package 11A (and 11B) according to the present embodiment, the magnetic film 50 and metal film 60 are laminated in this order on the top surface 41 of the mold resin 40. With this configuration, as compared with a case where the magnetic film 50 and metal film 60 are laminated in the reverse order, electromagnetic noise radiated from the electronic components 31 and 32 can be shielded more effectively. This is because the electromagnetic wave noise radiated from the electronic components 31 and 32 is partially absorbed when it passes through the magnetic film 50, and the remaining electromagnetic wave noise that has not been absorbed is partially reflected by the metal film 60 and passes through the magnetic film 50 once again. In this manner, the magnetic film 50 acts on the incident electromagnetic wave noise twice, thereby effectively shielding the electromagnetic wave noise radiated from the electronic components 31 and 32.

Further, in the electronic circuit package 11A (and 11B) according to the present embodiment, the eddy current generated when the electromagnetic wave noise enters the metal film 60 hardly flows in the magnetic film 50 because the resistance value at the interface between the metal film 60 and the magnetic film 50 is equal to or larger than $10^6\Omega$. As a result, it becomes possible to prevent degradation in magnetic characteristics of the magnetic film 50 due to inflow of the eddy current.

Further, forming the magnetic film 50 directly on the top surface 41 of the mold resin 40 is advantageous for height reduction of production because no adhesive or the like intervenes between them. In addition, in the present embodiment, the magnetic film 50 is formed only on the top surface 41 of the mold resin 40, so that the metal film 60 can be easily connected to the power supply pattern 25G.

The following describes a manufacturing method for the electronic circuit package 11A according to the present embodiment.

FIGS. 3 to 6 are process views for explaining a manufacturing method for the electronic circuit package 11A.

Figure 3:
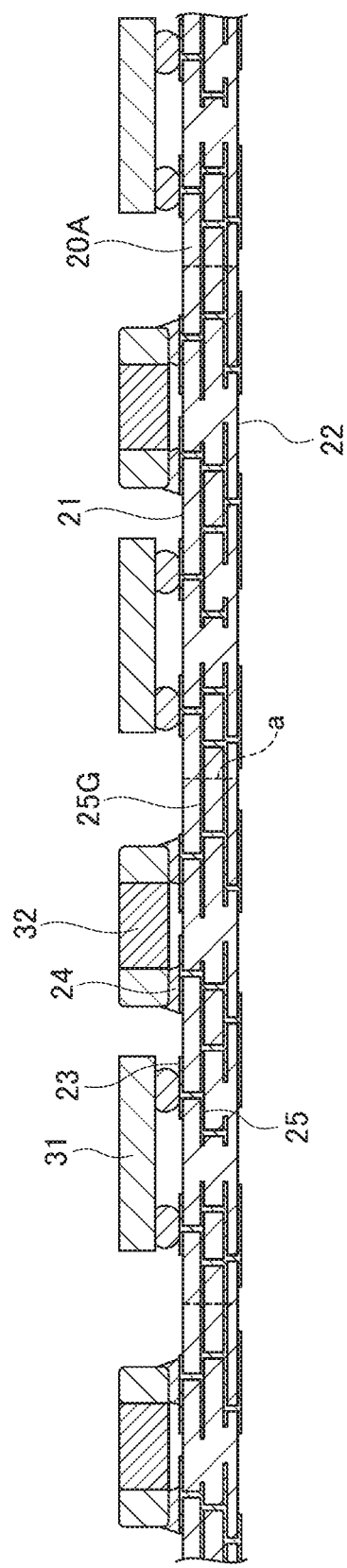
FIGS. 3 to 6 are process views for explaining a manufacturing method for the electronic circuit package shown in FIG. 1.

As illustrated in FIG. 3, an assembly substrate 20A having a multilayer wiring structure is prepared. A plurality of the land patterns 23 are formed on the front surface 21 of the assembly substrate 20A, and a plurality of the external terminals 26 are formed on the back surface 22 of the assembly substrate 20A. Further, a plurality of the internal wirings 25 including the power supply patterns 25G are formed in an inner layer of the assembly substrate 20A. A dashed line a in FIG. 3 denotes apart to be cut in a subsequent dicing process. As illustrated in FIG. 3, the power supply patterns 25G are provided at a position overlapping the dashed line a in a plan view.

Then, as illustrated in FIG. 3, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Figure 4:
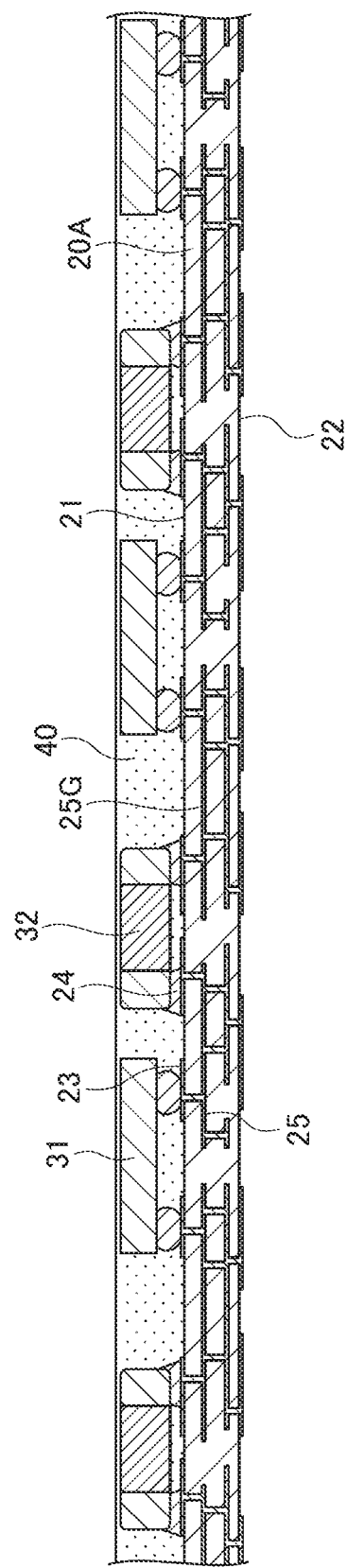

Then, as illustrated in FIG. 4, the front surface 21 of the assembly substrate 20A is covered with the mold resin 40 so as to embed the electronic components 31 and 32 in the mold resin 40. As the formation method for the mold resin 40, compression, injection, print, dispense, nozzle coating process, and the like can be used.

Figure 5:
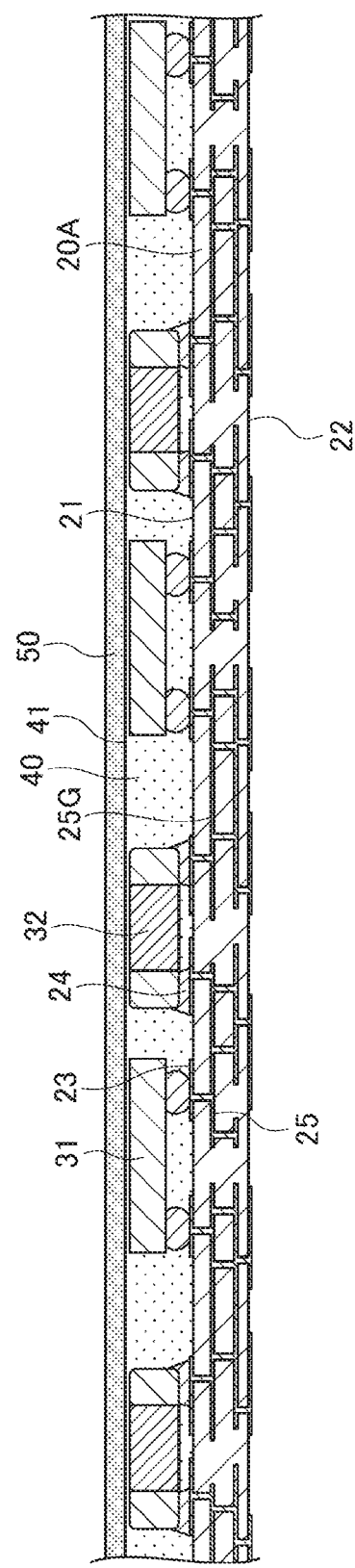

Then, as illustrated in FIG. 5, the magnetic film 50 formed of a material having a surface resistance value of $10^6\Omega$ or larger is formed on the upper surface 41 of the molding resin 40. In this case, in order to enhance adhesion between the molding resin 40 and the magnetic film 50, the upper surface 41 of the molding resin 40 may be subjected to blasting or etching to form a physical irregularity thereon, may be subjected to surface modification by means of plasma or short wavelength UV, or may be subjected to organofunctional coupling treatment. In case that a material having a surface resistance value smaller than $10^6\Omega$ is used as the material of the magnetic film 50, after formation of the magnetic film 50, an insulating film 70 formed of a thermosetting material, a heat-resistance thermoplastic material, or an insulating material such as an oxide of Si or a low-melting-point glass may be formed thinly on the upper surface 51 of the magnetic film 50.

In case that the film formed of a composite magnetic material is used as the magnetic film 50, a thick-film formation method such as a printing method, a molding method, a slit nozzle coating method, a spray method, a dispensing method, an injection method, a transfer method, a compression molding method, or a lamination method using an uncured sheet-like resin can be used. When the magnetic film 50 is formed by using the printing method, slit nozzle coating method, spraying method, or dispensing method, the viscosity of the composite magnetic material is preferably controlled as needed. The viscosity control may be made by diluting the composite magnetic material with one or two or more solvents having a boiling point of 50° C. to 300° C. The thermosetting material mainly consists of a main agent, a curing agent, and a curing accelerator; however, two or more kinds of main agent or curing agent may be blended according to required characteristics. Further, solvents may be mixed and a coupling agent for enhancing adhesion and fluidity, a fire retardant for flame retardancy, a dye and a pigment for coloration, a non-reactive resin material for imparting flexibility, and a non-magnetic filler for adjusting a thermal expansion coefficient may be blended or combined. The materials may be kneaded or dispersed by a known means such as a kneader, a mixer, a vacuum defoaming stirring machine, or a three-roll mill.

In case that the thin film formed of a soft magnetic material or a ferrite is used as the magnetic film 50, a plating method, a spray method, an AD method, and a thermal spraying method, as well as a thin-film formation method such as a sputtering method or a vapor-deposition method may be used. In case that a foil or a bulk sheet is used as the magnetic film 50, it becomes possible to directly form the magnetic film 50 consisting of a foil or a bulk sheet on the top surface 41 of the mold resin 40 by previously setting the foil or bulk sheet in a mold for forming the mold resin 40.

Figure 6:
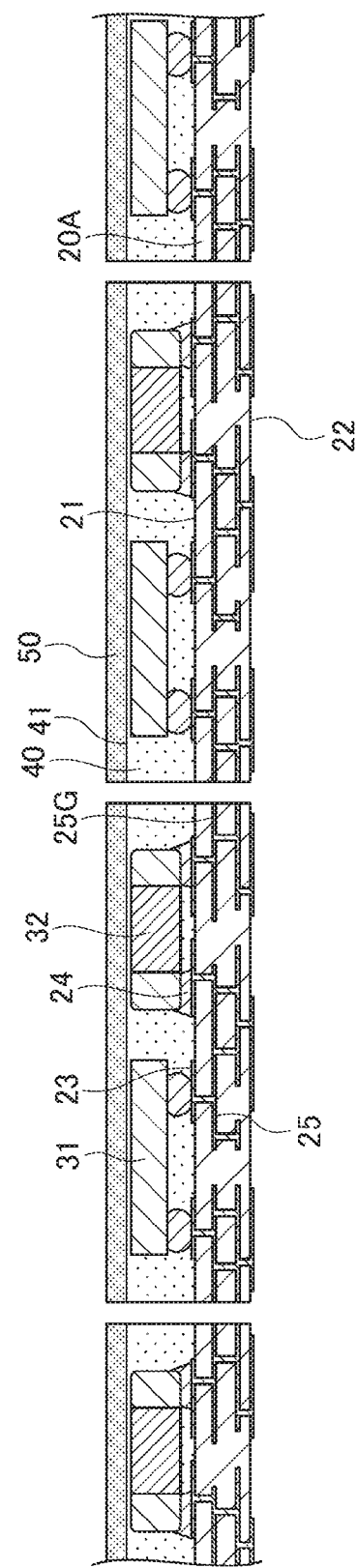

Then, as illustrated in FIG. 6, the assembly substrate 20A is cut along the dashed line a to divide the assembly substrate 20A into individual substrates 20. In the present embodiment, because the power supply patterns 25G pass the dashed line a as a dicing position, the power supply patterns 25G are exposed from the side surface 27 of the substrate 20 when the assembly substrate 20A is cut along the dashed line a.

Then, the metal film 60 is formed so as to cover the top surface 51 and side surface 52 of the magnetic film 50, side surface 42 of the mold resin 40, and side surface 27 of the substrate 20, whereby the electronic circuit package 11A according to the present embodiment is completed. As a formation method for the metal film 60, a sputtering method, a vapor-deposition method, an electroless plating method, and an electrolytic plating method can be used. Before formation of the metal film 60, pretreatment for enhancing adhesion, such as plasma treatment, coupling treatment, blast treatment, or etching treatment, may be performed. As a base of the metal film 60, a high adhesion metal film such as a titanium or a chromium may be formed thinly in advance.

As described above, according to the manufacturing method for the electronic circuit package 11A of the present embodiment, it becomes possible to make the resistance value at the interface between the metal film 60 and the magnetic film 50 equal to or larger than $10^6 \Omega$ because the magnetic film 50 formed of a material having a surface resistance value of equal to or larger than $10^6 \Omega$ is formed, or the insulating film 70 is formed thinly on the upper surface of the magnetic film 50. In addition, the power supply pattern 25G is exposed by cutting the assembly substrate 20A, whereby the metal film 60 can be easily and reliably connected to the power supply pattern 25G.

Figure 7:
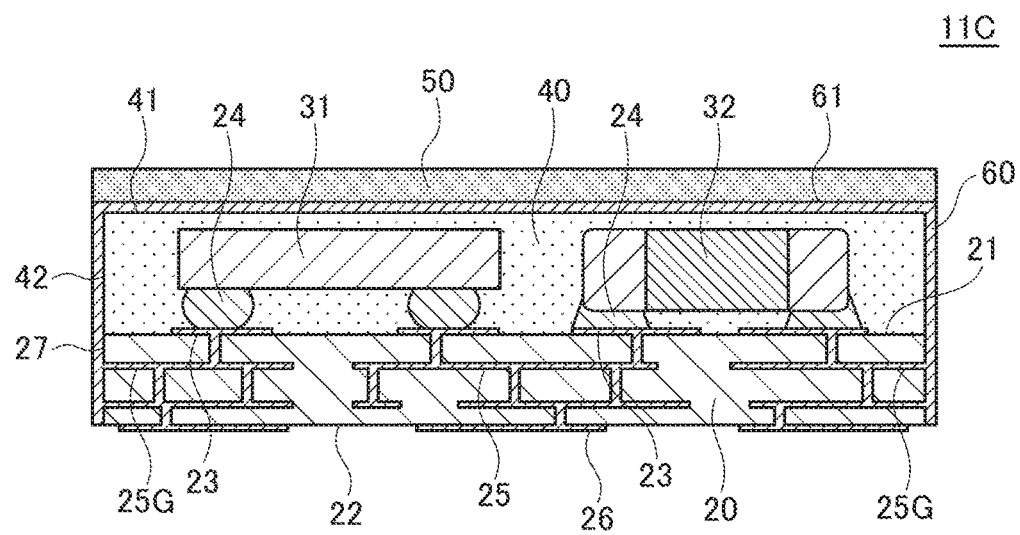
FIG. 7 is a cross-sectional view illustrating a configuration of an electronic circuit package according to an another modification of the first embodiment.
Figure 8:
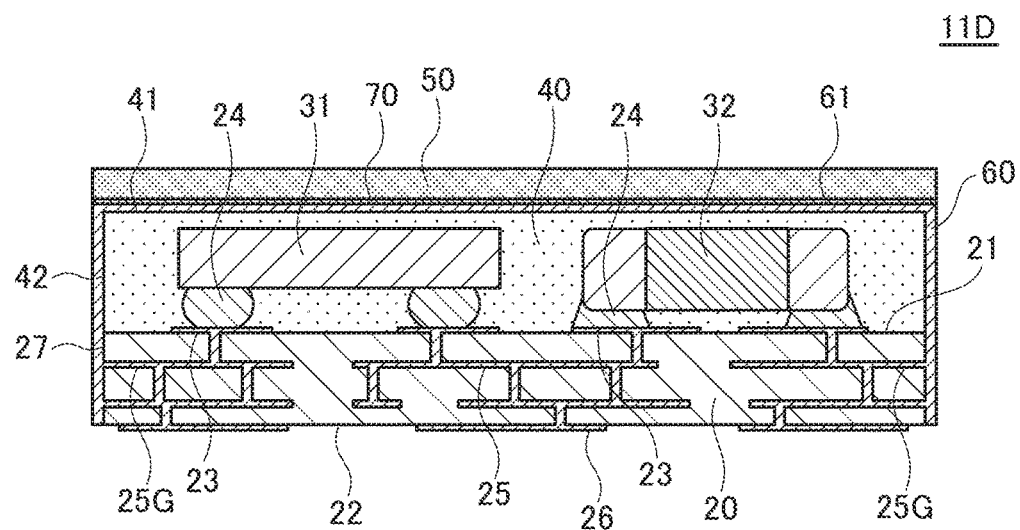
FIG. 8 is a cross-sectional view illustrating a configuration of an electronic circuit package according to a still another modification of the first embodiment.

FIG. 7 is a cross-sectional view illustrating the configuration of an electronic circuit package 11C according to a modification of the first embodiment. The electronic circuit package 11C illustrated in FIG. 7 differs from the electronic circuit package 11A illustrated in FIG. 1 in that the magnetic film 50 is formed on an upper surface 61 of the metal film 60. That is, the positional relationship between the magnetic film 50 and the metal film 60 constituting the laminated film is inverted. Other configurations are the same as those of the electronic circuit package 11A of FIG. 1. Even in such a configuration, it becomes possible to prevent deterioration in the magnetic characteristics of the magnetic film 50 due to inflow of an eddy current because the eddy current generated by electromagnetic wave noise entering the metal film 60 hardly flows in the magnetic film 50. In case that a material having a comparatively low resistance value is used as the material of the magnetic film 50, the thin insulating film 70 is preferably be interposed between the metal film 60 and the magnetic film 50 as in an electronic circuit package 11D illustrated in FIG. 8. When the magnetic film 50 functions as antioxidant film for the metal film 60, a specific antioxidant film need not be applied to the upper surface 61 of the metal film 60; however, even in such a case, it is desirable to apply an antioxidant film to the upper surface 61 of the metal film 60 in view of enhancing reliability.

Figure 9:
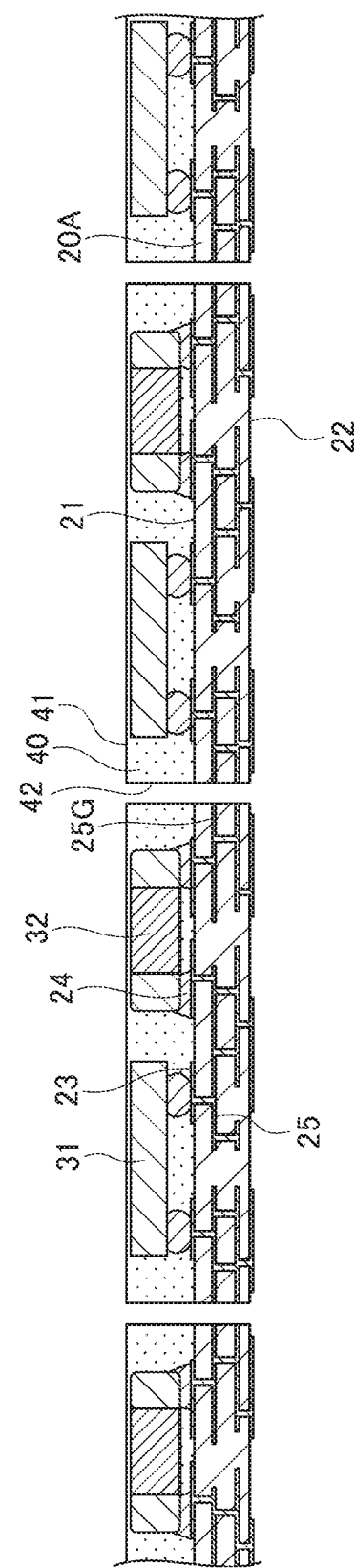
FIGS. 9 and 10 are process views for explaining a manufacturing method for the electronic circuit package shown in FIG. 7.
Figure 10:
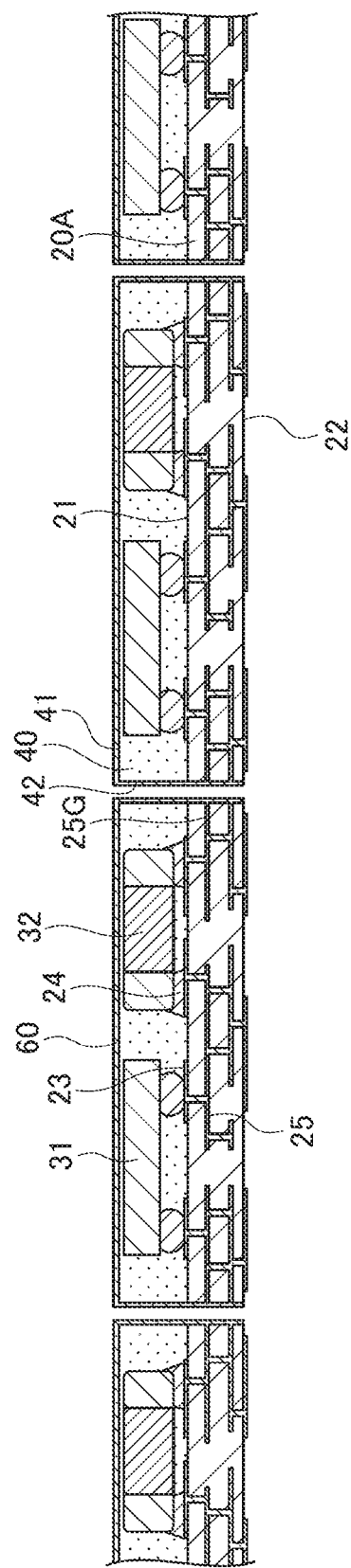

FIGS. 9 and 10 are process views for explaining the manufacturing method for the electronic circuit package 11C.

First, the molding resin 40 is formed according to the method illustrated in FIGS. 3 and 4, and then the assembly substrate 20A is cut along the dashed line a indicating a dicing position to individuate the substrate 20 as illustrated in FIG. 9.

Then, as illustrated in FIG. 10, the metal film 60 is formed so as to cover the upper surface 41 and side surface 42 of the molding resin 40 and the side surface 27 of the substrate 20. As a result, the metal film 60 is connected to the power supply pattern 25G exposed to the side surface 27 of the substrate 20. Then, the magnetic film 50 formed of a material having a surface resistance value of $10^6 \Omega$ or larger is formed on the upper surface 61 of the metal film 60, whereby the electronic circuit package 11c illustrated in FIG. 7 is completed. In case that a material having a comparatively low resistance value is used as the material of the magnetic film 50, after formation of the metal film 60 and before formation of the magnetic film 50, an insulating film 70 formed of a thermosetting material or an insulating material such as an oxide of Si or a low-melting-point glass is formed thinly, whereby the electronic circuit package 11D of FIG. 8 can be obtained.

Second Embodiment

Figure 11:
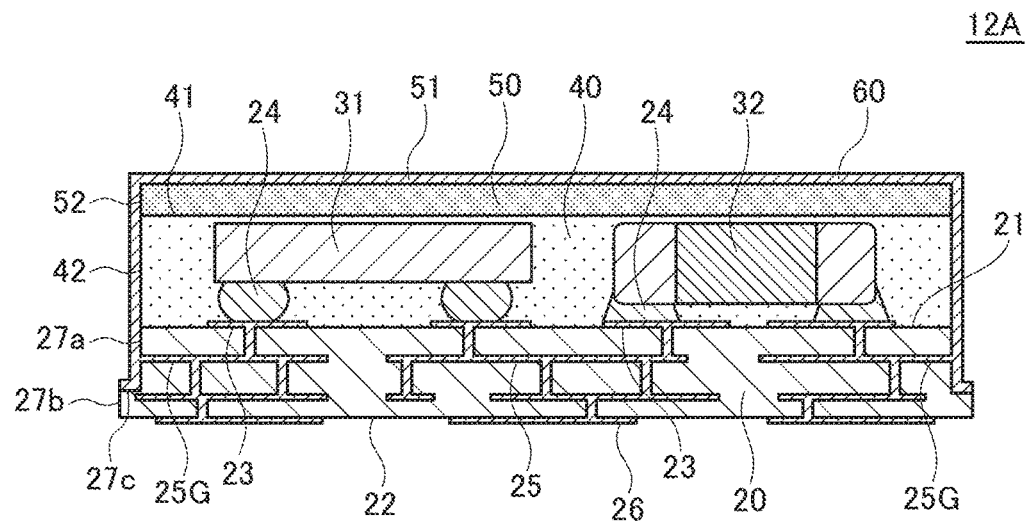
FIG. 11 is a cross-sectional view illustrating a configuration of an electronic circuit package according to a second embodiment of the present invention.

FIG. 11 is a cross-sectional view illustrating a configuration of an electronic circuit package 12A according to the second embodiment of the present invention.

As illustrated in FIG. 11, an electronic circuit package 12A according to the present embodiment is the same as the electronic circuit package 11A according to the first embodiment illustrated in FIG. 1 except for shapes of the substrate 20 and metal film 60. Thus, the same reference numerals are given to the same elements, and overlapping descriptions will be omitted.

Figure 12:
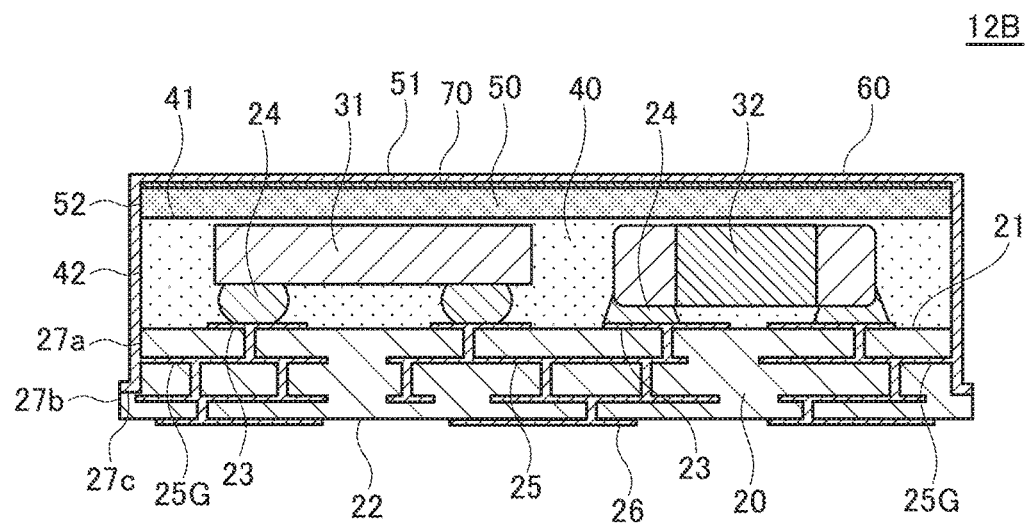
FIG. 12 is a cross-sectional view illustrating a configuration of an electronic circuit package according to a modification of the second embodiment.

In the present embodiment, the side surface 27 of the substrate 20 is formed stepwise. Specifically, a side surface lower portion 27b protrudes from a side surface upper portion 27a. The metal film 60 is not formed over the entire side surface of the substrate 20 but formed so as to cover the side surface upper portion 27a and a step portion 27c. The side surface lower portion 27b is not covered with the metal film 60. Also in the present embodiment, the power supply patterns 25G are exposed from the side surface upper portion 27a of the substrate 20, so that the metal film 60 is connected to the power supply patterns 25G at the exposed portion. In case that a material having relatively low resistance value is used as the magnetic film 50, it is required that the thin insulating film 70 interposed between the magnetic film 50 and the metal film 60 is used as in an electronic circuit package 12B according to a modification illustrated in FIG. 12.

Figure 13:
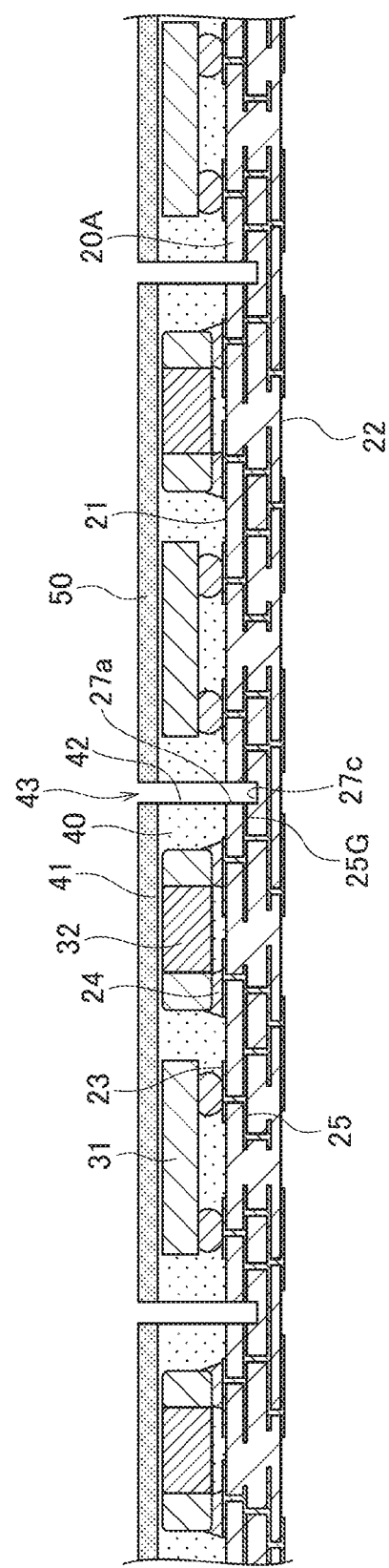
FIGS. 13 and 14 are process views for explaining a manufacturing method for the electronic circuit package shown in FIG. 11.
Figure 14:
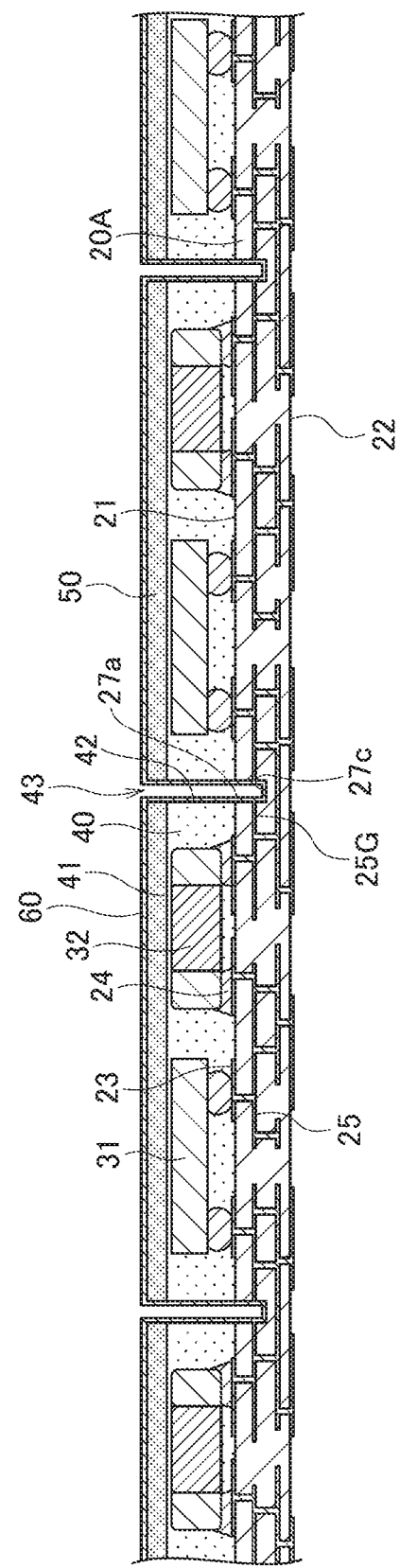

FIGS. 13 and 14 are process views for explaining a manufacturing method for the electronic circuit package 12A.

First, the magnetic film 50 is formed on the top surface 41 of the mold resin 40 by using the method described using FIGS. 3 to 5. Then, as illustrated in FIG. 13, a groove 43 is formed along the dashed line a denoting the dicing position. The groove 43 is formed to have such a depth that the groove 43 completely cuts the molding resin 40 and does not completely cut the substrate 20. As a result, the side surface 42 of the mold resin 40 and side surface upper portion 27a and step portion 27c of the substrate 20 are exposed inside the groove 43. A depth of the groove 43 is set so as to allow at least the power supply patterns 25G to be exposed from the side surface upper portion 27a. In case that the insulating film 70 is interposed between the magnetic film 50 and the metal film 60 as in the modification illustrated in FIG. 12, a thermosetting material, a heat-resistant thermoplastic material, or an insulating material such as an Si oxide, a low-melting point glass may be thinly formed on the top surface 51 of the magnetic film 50 before forming the groove 43.

Then, as illustrated in FIG. 14, the metal film 60 is formed by using a sputtering method, a vapor-deposition method, an electroless plating method, an electrolytic plating method, or the like. As a result, the top surface 51 of the magnetic film 50 and inside of the groove 43 are covered with the metal film 60. At this time, the power supply patterns 25G exposed to the side surface upper portion 27a of the substrate 20 are connected to the metal film 60.

Then, the assembly substrate 20A is cut along the dashed line a to divide the assembly substrate 20A into individual substrates 20, whereby the electronic circuit package 12A according to the present embodiment is completed.

As described above, according to the manufacturing method for the electronic circuit package 12A of the present embodiment, formation of the groove 43 allows the metal film 60 to be formed before dividing the assembly substrate 20A into individual substrates 20, thereby forming the metal film 60 easily and reliably.

Figure 15:
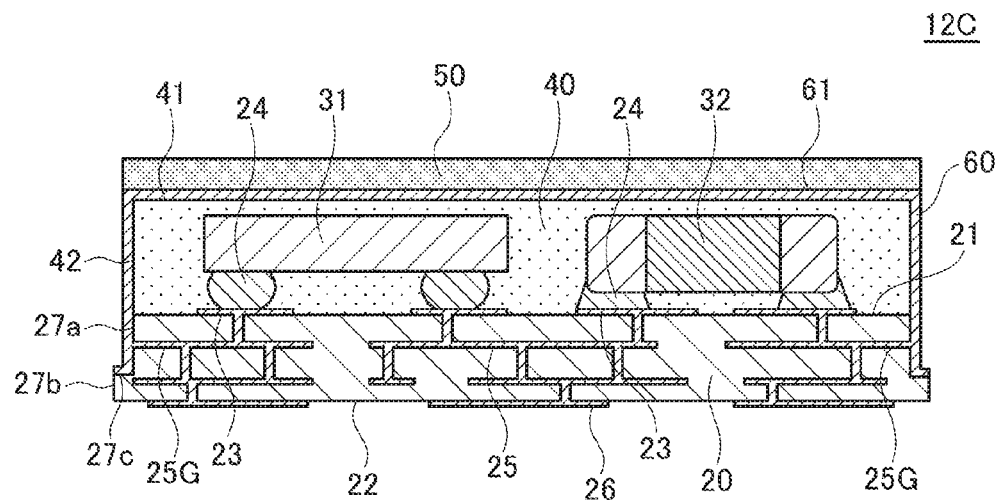
FIG. 15 is a cross-sectional view illustrating a configuration of an electronic circuit package according to an another modification of the second embodiment.
Figure 16:
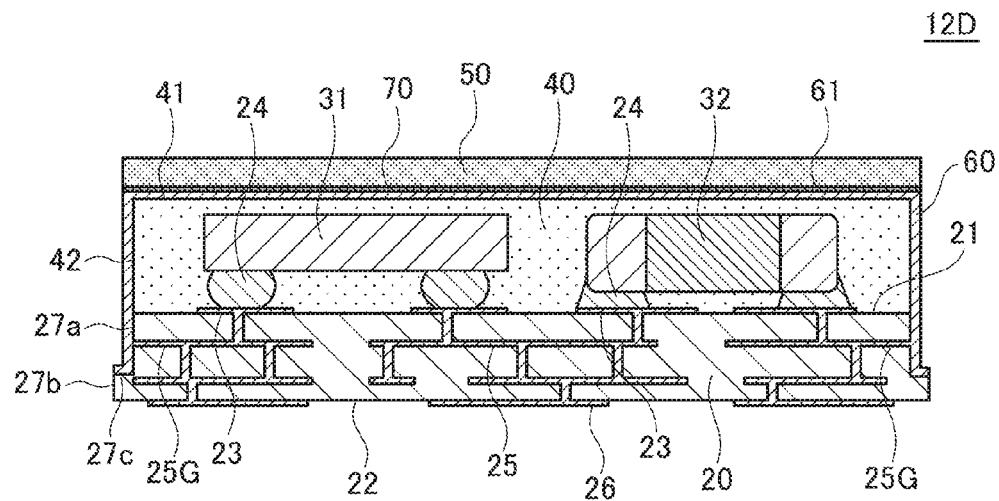
FIG. 16 is a cross-sectional view illustrating a configuration of an electronic circuit package according to a still another modification of the second embodiment.

FIG. 15 is a cross-sectional view illustrating the configuration of an electronic circuit package 12C according to a modification of the second embodiment. The electronic circuit package 12C illustrated in FIG. 15 differs from the electronic circuit package 12A illustrated in FIG. 11 in that the magnetic film 50 is formed on the upper surface 61 of the metal film 60. That is, the positional relationship between the magnetic film 50 and the metal film 60 constituting the laminated film is inverted. Other configurations are the same as those of the electronic circuit package 12A of FIG. 11. Even in such a configuration, it becomes possible to prevent deterioration in the magnetic characteristics of the magnetic film 50 due to inflow of an eddy current because the eddy current generated by electromagnetic wave noise entering the metal film 60 hardly flows in the magnetic film 50. In case that a material having a comparatively low resistance value is used as the material of the magnetic film 50, the thin insulating film 70 is preferably interposed between the metal film 60 and the magnetic film 50 as in an electronic circuit package 12D illustrated in FIG. 16.

Third Embodiment

Figure 17:
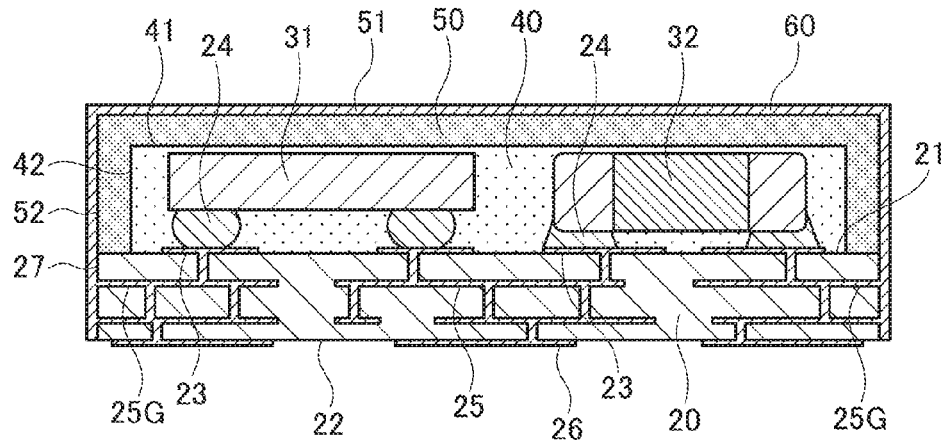
FIG. 17 is a cross-sectional view illustrating a configuration of an electronic circuit package according to a third embodiment of the present invention.

FIG. 17 is a cross-sectional view illustrating a configuration of an electronic circuit package 13A according to the third embodiment of the present invention.

As illustrated in FIG. 17, the electronic circuit package 13A according to the present embodiment differs from the electronic circuit package 11A according to the first embodiment illustrated in FIG. 1 in that the magnetic film 50 covers not only the top surface 41 of the mold resin 40, but also the side surface 42. Other configurations are the same as those of the electronic circuit package 11A according to the first embodiment. Thus, the same reference numerals are given to the same elements, and overlapping descriptions will be omitted.

In the present embodiment, the side surface 42 of the mold resin 40 is fully covered with the magnetic film 50, and thus, a part where the mold resin 40 and metal film 60 contact each other does not substantially exist. With this configuration, a composite-shield effect in the side surface of the mold resin 40 is enhanced. In particular, electromagnetic noise radiated in a side surface direction of the mold resin 40 is effectively shielded.

Figure 18:
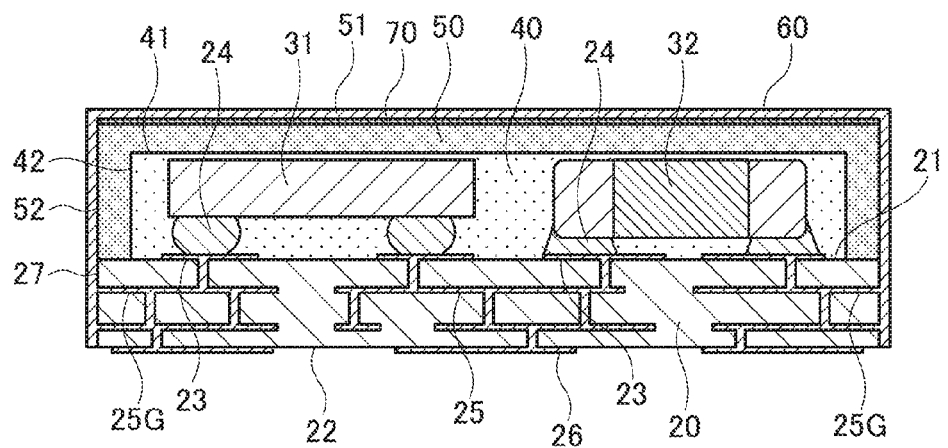
FIG. 18 is a cross-sectional view illustrating a configuration of an electronic circuit package according to a modification of the third embodiment.
Figure 19:
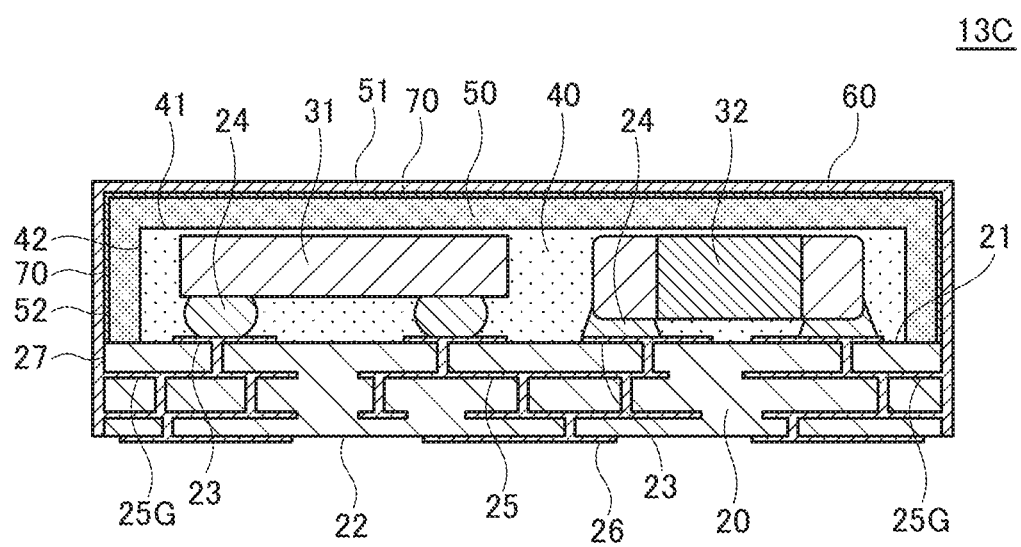
FIG. 19 is a cross-sectional view illustrating a configuration of an electronic circuit package according to an another modification of the third embodiment.

In case that a material having a comparatively low resistance value is used as the material for the magnetic film 50, the thin insulating film 70 is required to be interposed between the top surface 51 of the magnetic film 50 and the metal film 60 as in an electronic circuit package 13B according to a modification illustrated in FIG. 18, and more preferably, the thin insulating film 70 is interposed between the top surface 51 and side surface 52 of the magnetic film 50 and the metal film 60 as in an electronic circuit package 13C according to another modification illustrated in FIG. 19.

Figure 20:
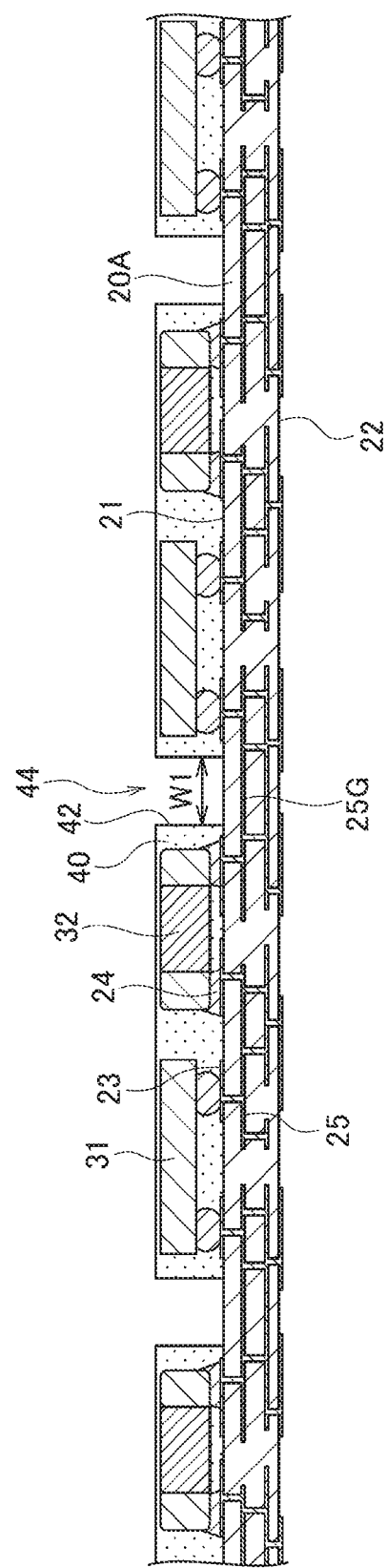
FIGS. 20 to 22 are process views for explaining a manufacturing method for the electronic circuit package shown in FIG. 17.
Figure 21:
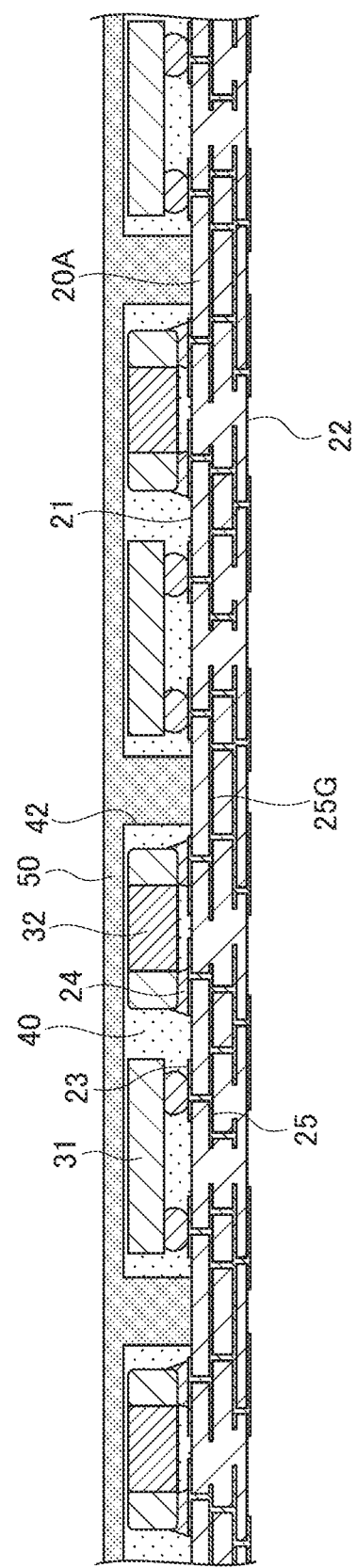
Figure 22:
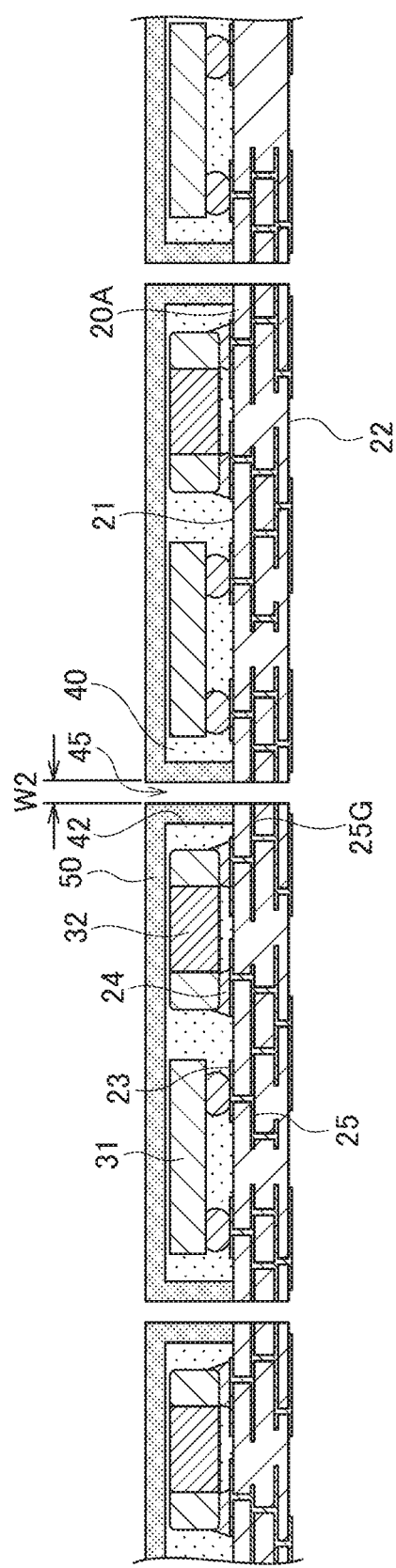

FIGS. 20 to 22 are process views for explaining a manufacturing method for the electronic circuit package 13A.

First, the mold resin 40 is formed by the method described using FIGS. 3 and 4. Then, as illustrated in FIG. 20, a groove 44 having a width W1 is formed along a dashed line a indicating a dicing position. The groove 44 is formed to have such a depth that the groove 44 completely cuts the molding resin 40 and does not reach the inner wiring 25 formed in the substrate 20. As a result, the side surface 42 of the mold resin 40 and the surface 21 of the substrate 20 are exposed inside the groove 44.

Then, as illustrated in FIG. 21, the magnetic film 50 is formed to fill the groove 44. Although it is not essential to completely fill the groove 44 with the magnetic film 50 at this time, if the groove 44 is filled with the magnetic film 50, it is necessary to use the composite magnetic material as the magnetic film 50 because the magnetic film 50 needs to have a certain film thickness. Thus, the magnetic film 50 is directly formed on the top surface 41 and side surface 42 of the mold resin 40, and the surface 21 of the substrate 20 exposed to the bottom of the groove 44 is also covered with the magnetic film 50. Further, as in the modification illustrated in FIG. 18, in case that the insulating film 70 is required to be interposed between the top surface 51 of the magnetic film 50 and the metal film 60, after formation of the magnetic film 50, a thermosetting material, a heat-resistant thermoplastic material, or an insulating material such as an Si oxide or a low-melting point glass may be thinly formed on the top surface 51 of the magnetic film 50.

Then, as illustrated in FIG. 22, the assembly substrate 20A is cut by forming a groove 45 having a width W2 along the dashed line a to divide the assembly substrate 20A into individual substrates 20. At this time, the width W2 of the groove 45 needs to be smaller than the width W1 of the groove 44. As a result, the substrates 20 are individuated while the magnetic film 50 formed inside the groove 44 is left. Further, as in the modification illustrated in FIG. 19, in case that the insulating film 70 is interposed between the top surface 51 and side surface 52 of the magnetic film 50 and the metal film 60, after the side surface 52 of the magnetic film 50 is exposed by the groove 45 without individuation of the assembly substrate 20A, then a thermosetting material, a heat-resistant thermoplastic material, or an insulating material such as an Si oxide or a low-melting point glass is thinly formed on the top surface 51 and side surface 52 of the magnetic film 50, followed by cutting of the assembly substrate 20.

Then, the metal film 60 is formed so as to cover the top surface 51 and side surface 52 of the magnetic film 50 and the side surface 27 of the substrate 20, whereby the electronic circuit package 13A according to the present embodiment is completed.

As described above, in the manufacturing method for the electronic circuit package 13A according to the present embodiment, the two grooves 44 and 45 having different widths are sequentially formed, whereby the side surface 42 of the mold resin 40 can be covered with the magnetic film 50 without use of a complicated process.

Figure 23:
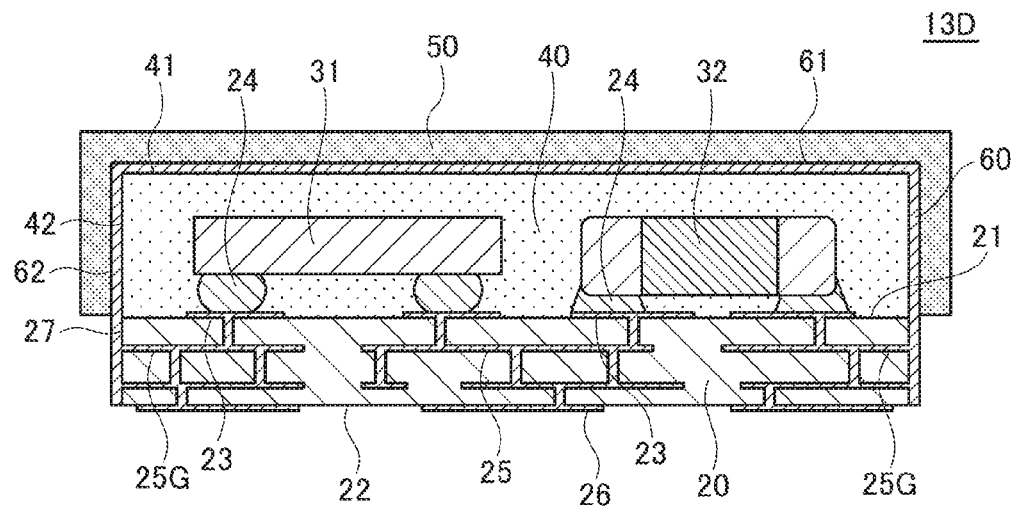
FIG. 23 is a cross-sectional view illustrating a configuration of an electronic circuit package according to a still another modification of the third embodiment.
Figure 24:
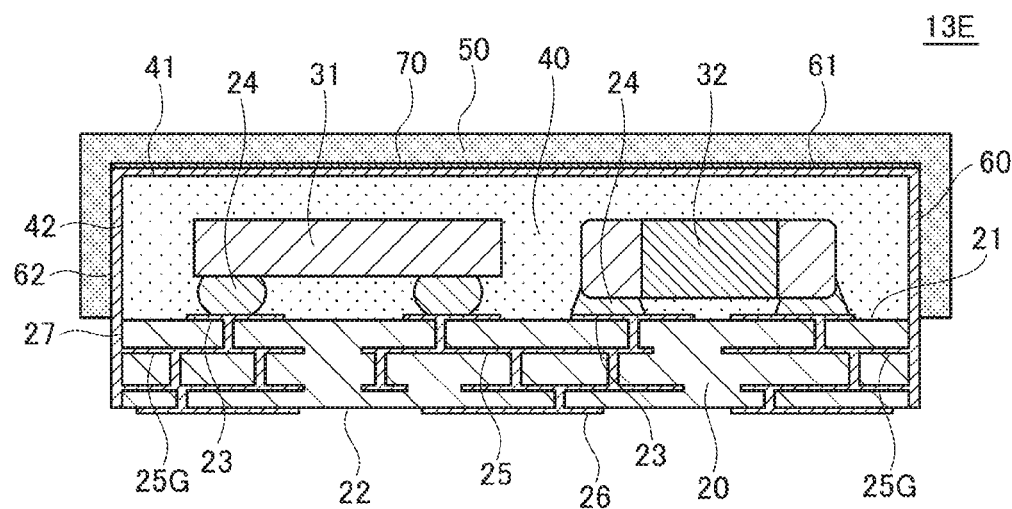
FIG. 24 is a cross-sectional view illustrating a configuration of an electronic circuit package according to a still another modification of the third embodiment.
Figure 25:
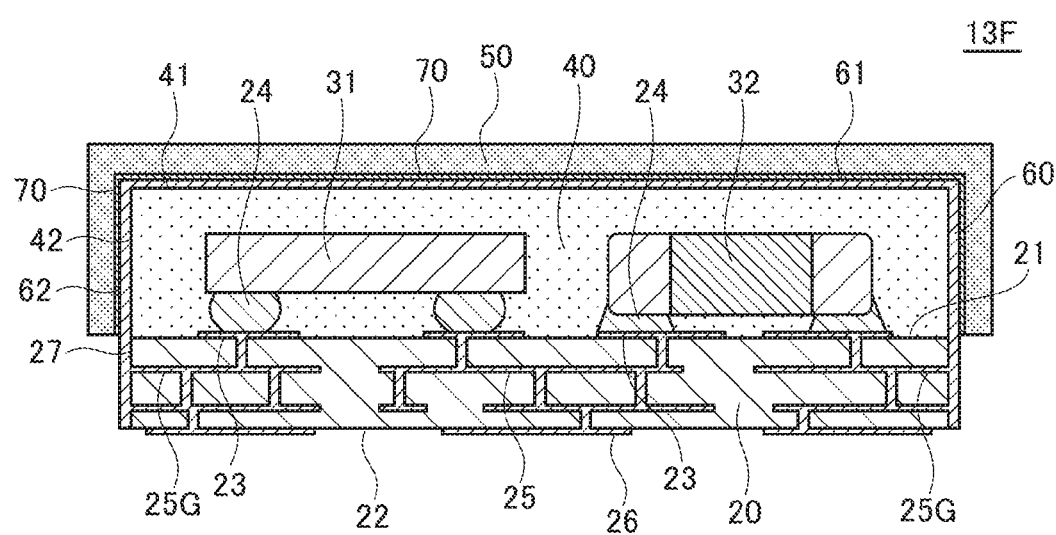
FIG. 25 is a cross-sectional view illustrating a configuration of an electronic circuit package according to a still another modification of the third embodiment.

FIG. 23 is a cross-sectional view illustrating the configuration of an electronic circuit package 13D according to a modification of the third embodiment. The electronic circuit package 13D illustrated in FIG. 23 differs from the electronic circuit package 13A illustrated in FIG. 17 in that the magnetic film 50 is formed on the upper surface 61 and side surface 62 of the metal film 60. That is, the positional relationship between the magnetic film 50 and the metal film 60 constituting the laminated film is inverted. Other configurations are the same as those of the electronic circuit package 13A of FIG. 17. Even in such a configuration, it becomes possible to prevent deterioration in the magnetic characteristics of the magnetic film 50 due to inflow of an eddy current because the eddy current generated by electromagnetic wave noise entering the metal film 60 hardly flows in the magnetic film 50. In case that a material having a comparatively low resistance value is used as the material of the magnetic film 50, the thin insulating film 70 is preferably interposed between the upper surface 61 of the metal film 60 and the magnetic film 50 as in an electronic circuit package 13E illustrated in FIG. 24 and, more preferably, the thin insulating film 70 is interposed between the upper surface 61 and side surface 62 of the metal film 60 and the magnetic film 50 as in an electronic circuit package 13F illustrated in FIG. 25.

Fourth Embodiment

Figure 26:
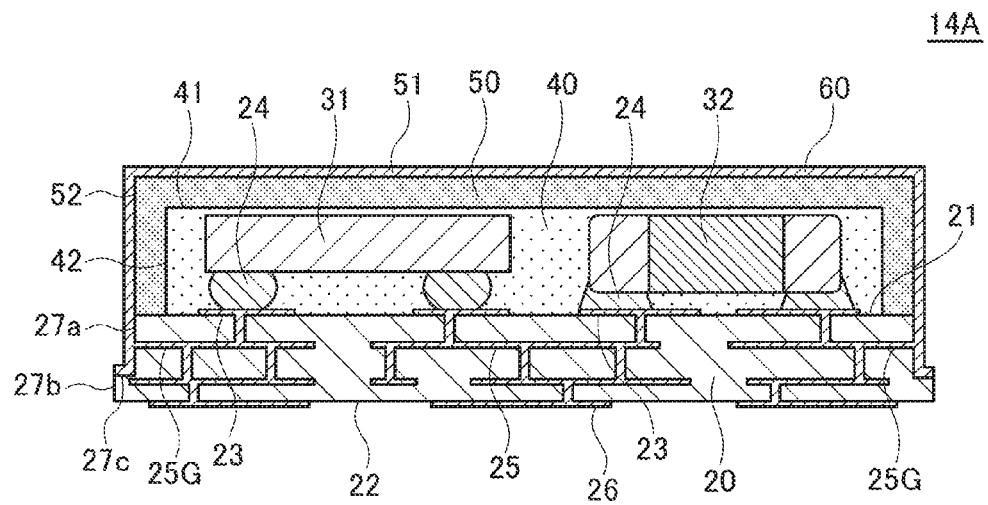
FIG. 26 is a cross-sectional view illustrating a configuration of an electronic circuit package according to a fourth embodiment of the present invention.

FIG. 26 is a cross-sectional view illustrating a configuration of an electronic circuit package 14A according to the fourth embodiment of the present invention.

As illustrated in FIG. 26, the electronic circuit package 14A according to the present embodiment has the same configuration as that of the electronic circuit package 13A according to the third embodiment illustrated in FIG. 17 except for shapes of the substrate 20 and metal film 60. Thus, the same reference numerals are given to the same elements, and overlapping descriptions will be omitted.

Figure 27:
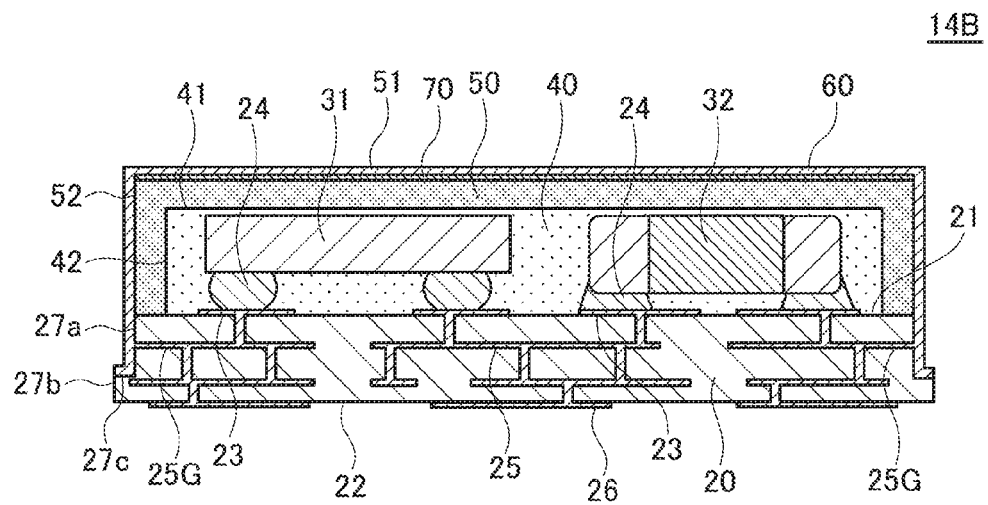
FIG. 27 is a cross-sectional view illustrating a configuration of an electronic circuit package according to a modification of the fourth embodiment.

In the present embodiment, as in the second embodiment, the side surface lower portion 27b of the substrate 20 protrudes from the side surface upper portion 27a, and the metal film 60 is formed so as to cover the side surface upper portion 27a and step portion 27c. Also in the present embodiment, the power supply pattern 25G is exposed to the side surface upper portion 27a of the substrate 20, so that the metal film 60 is connected to the power supply pattern 25G through this portion. In case that a material having a comparatively low resistance value is used as the material for the magnetic film 50, the thin insulating film 70 is required to be interposed between the top surface 51 (and side surface 52) of the magnetic film 50 and the metal film 60 as in an electronic circuit package 14B according to a modification illustrated in FIG. 27.

Figure 28:
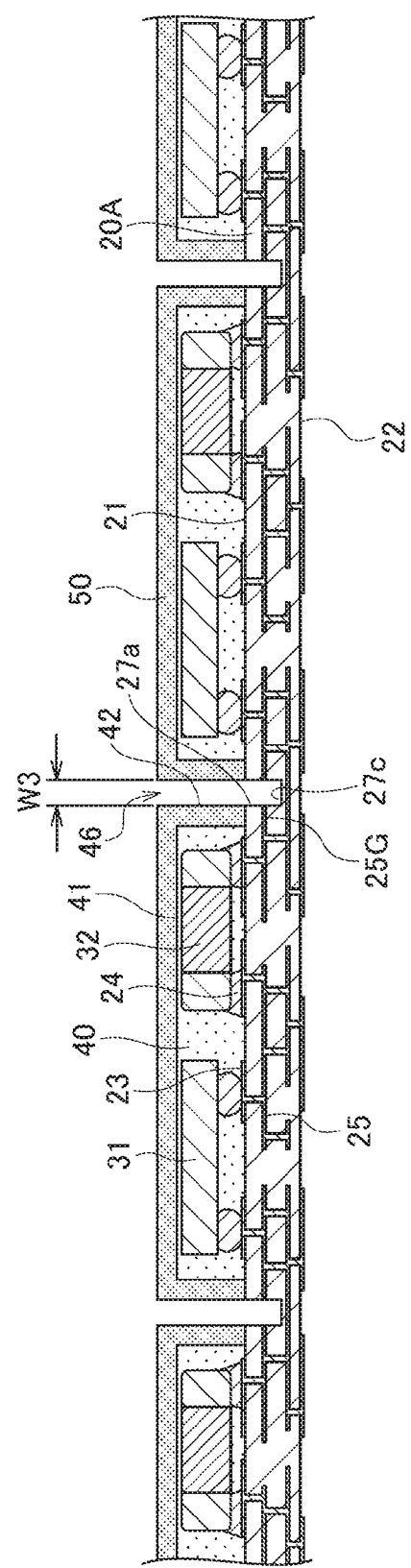
FIGS. 28 and 29 are process views for explaining a manufacturing method for the electronic circuit package shown in FIG. 26.
Figure 29:
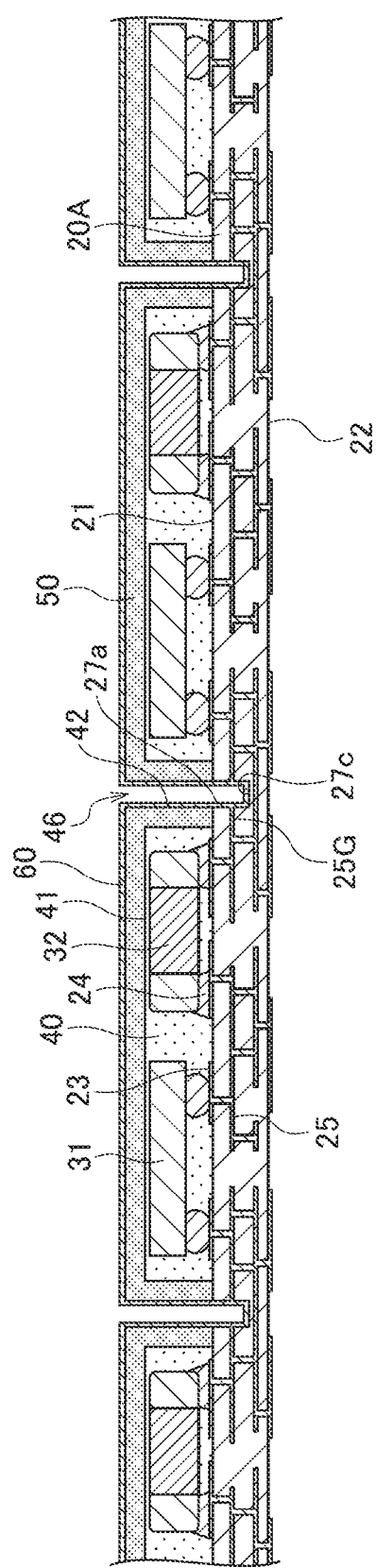

FIGS. 28 and 29 are process views for explaining a manufacturing method for the electronic circuit package 14A.

First, the magnetic film 50 is formed on the top surface 41 of the mold resin 40 and inside the groove 44 by the method described using FIGS. 3, 4, 20, and 21. Then, as illustrated in FIG. 28, a groove 46 having a width W3 is formed along the dashed line a indicating the dicing position. The groove 46 is formed to have such a depth that the groove 46 completely cuts the molding resin 40 and does not completely cut the substrate 20. The width W3 is made smaller than the width W1 of the groove 44 shown in FIG. 20. As a result, the side surface 52 of the magnetic film 50 and the side surface upper portion 27a and step portion 27c of the substrate 20 are exposed inside the groove 46. The depth of the side surface upper portion 27a needs to be set to at least a depth allowing the power supply pattern 25G to be exposed.

Then, as illustrated in FIG. 29, the metal film 60 is formed using a sputtering method, a vapor-deposition method, an electroless plating method, an electrolytic plating method, or the like. As a result, the top surface 51 of the magnetic film 50 and inside of the groove 46 are covered with the metal film 60. At this time, the power supply pattern 25G exposed to the side surface upper portion 27a of the substrate 20 is connected to the metal film 60.

Then, the assembly substrate 20A is cut along the dashed line a to divide the assembly substrate 20A into individual substrates 20, whereby the electronic circuit package 14A according to the present embodiment is completed.

As described above, according to the manufacturing method for the electronic circuit package 14A of the present embodiment, the metal film 60 can, similarly to the second embodiment, be formed before substrate individuation, thereby facilitating formation of the metal film 60.

Figure 30:
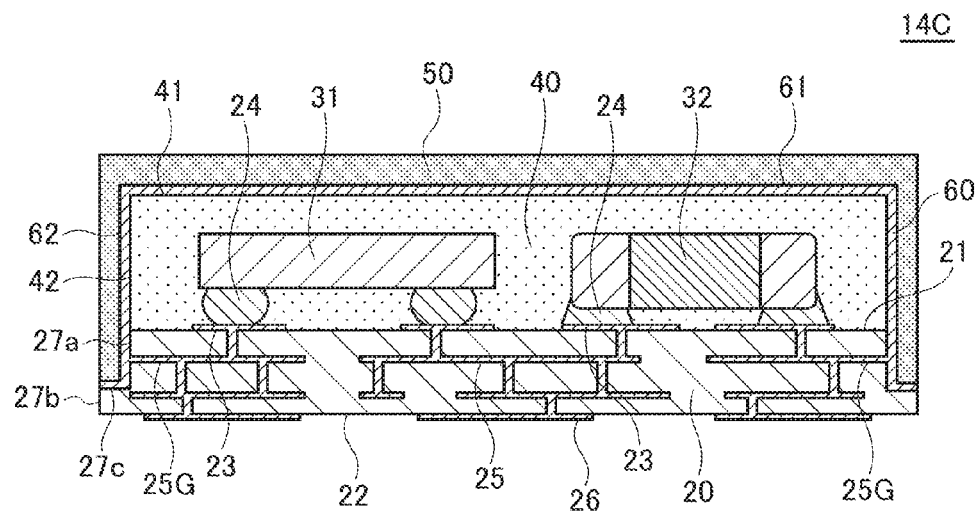
FIG. 30 is a cross-sectional view illustrating a configuration of an electronic circuit package according to an another modification of the fourth embodiment.
Figure 31:
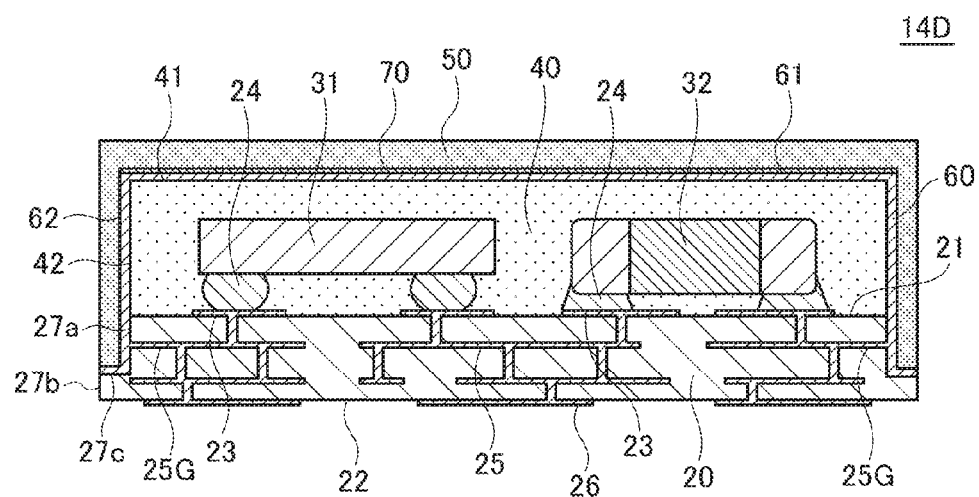
FIG. 31 is a cross-sectional view illustrating a configuration of an electronic circuit package according to a still another modification of the fourth embodiment.
Figure 32:
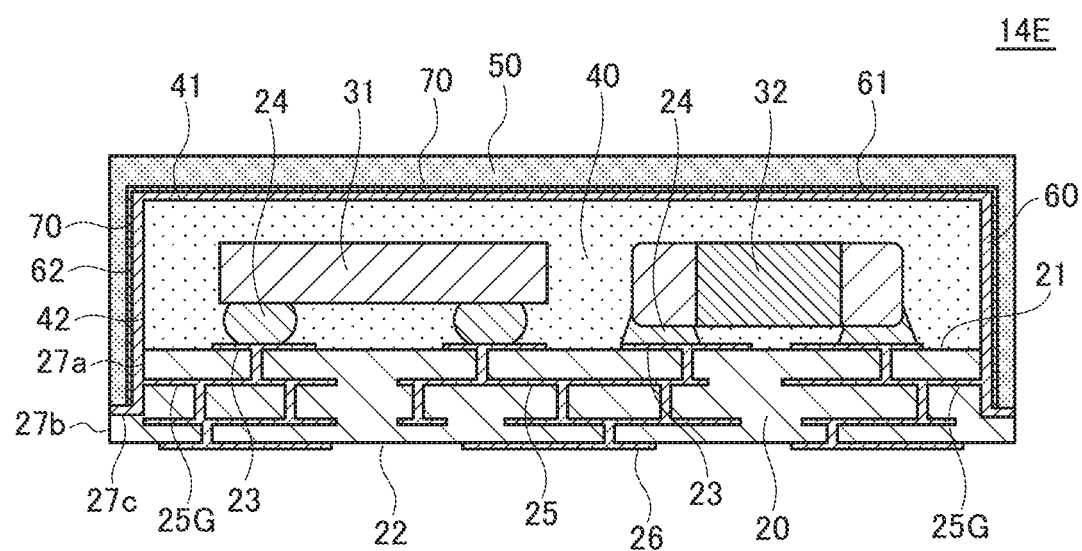
FIG. 32 is a cross-sectional view illustrating a configuration of an electronic circuit package according to a still another modification of the fourth embodiment.

FIG. 30 is a cross-sectional view illustrating the configuration of an electronic circuit package 14C according to a modification of the fourth embodiment. The electronic circuit package 14C illustrated in FIG. 30 differs from the electronic circuit package 14A illustrated in FIG. 26 in that the magnetic film 50 is formed on the upper and side surfaces 61 and 62 of the metal film 60. That is, the positional relationship between the magnetic film 50 and the metal film 60 constituting the laminated film is inverted. Other configurations are the same as those of the electronic circuit package 14A of FIG. 26. Even in such a configuration, it becomes possible to prevent deterioration in the magnetic characteristics of the magnetic film 50 due to inflow of an eddy current because the eddy current generated by electromagnetic wave noise entering the metal film 60 hardly flows in the magnetic film 50. In case that a material having a comparatively low resistance value is used as the material of the magnetic film 50, the thin insulating film 70 is preferably interposed between the upper surface 61 of the metal film 60 and the magnetic film 50 as in an electronic circuit package 14D illustrated in FIG. 31 and, more preferably, the thin insulating film 70 is interposed between the upper and side surfaces 61 and 62 of the metal film 60 and the magnetic film 50 as in an electronic circuit package 14E illustrated in FIG. 32.

While the preferred embodiments of the present invention have been described, the present invention is not limited thereto. It is needless to say that various modifications may be made without departing from the gist of the invention and all of the modifications thereof are included in the scope of the present invention.

EXAMPLES

<Production of Composite Magnetic Paste>

A composite magnetic paste A (comparative example) and a composite magnetic paste B (example) were produced as follows.

First, Fe—Si—Al flat soft magnetic metal SP-3A (D50=45 μm) manufactured by MATE Co., Ltd. as magnetic powder and 830S (bisphenol A type epoxy resin) manufactured by DIC. Co., Ltd. as epoxy resin were balanced such that the SP-3A is 70 wt % and the 830S is 30 wt %. Then, Curezol C11Z-CN made by Shikoku Chemicals Corporation as a curing accelerator and butylcarbitol acetate as a viscosity control solvent were added and blended to the resultant, followed by kneading and stirring processing by kneading/defoaming apparatus, whereby a liquid composite magnetic paste A (comparative example) was produced.

On the other hand, a composite magnetic paste B (example) was produced by the same method as above except that a $SiO_2$ coating was applied in a 40 nm thickness (observed in a cross section sample using an FE-SEM) on the surface of the magnetic powder by hydrolysis of metal alkoxide.

<Physical Property Evaluation of Composite Magnetic Paste>

(1) Measurement of Magnetic Permeability

The above composite magnetic pastes A and B were used to produce ring-shaped samples each having an outer diameter φ of 8 mm, an inner diameter φ of 3.1 mm, and a thickness of 2 mm, and a magnetic permeability μ' at 10 MHz was measured using a material analyzer function of Impedance Analyzer E4991 manufactured by Agilent Technologies Inc. As a result of the measurement, the magnetic permeability μ' of the sample produced using the composite magnetic paste A (comparative example) was 35, and that of the sample produced using the composite magnetic paste B (example) was 34. That is, there was no significant difference between the samples.

(2) Measurement of Surface Resistance Value

Then, the composite magnetic pastes A and B were applied in a 50 μm thickness to the entire surface of a substrate having a size of 30 mm×30 mm by screen printing, and then solvent was dried, followed by curing at 180° C. for 60 minutes, whereby a magnetic film was formed. Then, two measuring electrodes having a plane size of 10 mm×5 mm were formed on the surface of the magnetic film at an interval of 5 mm, followed by curing under predetermined curing conditions, whereby surface resistance value measuring samples A1 and B1 were obtained. The surface resistance value measuring sample A1 is the sample using the composite magnetic paste A (comparative example), and the surface resistance value measuring sample B1 is the sample using the composite magnetic paste B (example).

Further, surface resistance value measuring samples A2 and B2 was produced by adding a step of polishing the surface of the magnetic film after curing of the magnetic film and before formation of the measuring electrodes. The surface resistance value measuring sample A2 is the sample using the composite magnetic paste A (comparative example), and the surface resistance value measuring sample B2 is the sample using the composite magnetic paste B (example).

Then, high resistance meter 4339B manufactured by Agilent Technologies Inc. was used to apply 10 V between the two measuring electrodes for one minutes to thereby measure the surface resistance. The results are shown in Table 1.

TABLE 1

| | Sample | | | |
|---|---|---|---|---|
| | A1 | A2 | B1 | B2 |
| surface resistance value (Ω) | $5 \times 10^5$ | $1 \times 10^5$ | $1 \times 10^{10}$ | $5 \times 10^8$ |

As shown in Table 1, the surface resistance was smaller than $10^6 \Omega$ for the surface resistance value measuring samples A1 and A2, and the surface resistance was equal to or larger than $10^6 \Omega$ for the surface resistance value measuring samples B1 and B2. Further, it was confirmed that the surface resistance is reduced by polishing the surface of the magnetic film.

(3) Measurement of Noise Attenuation Amount

Next, the composite magnetic paste A (comparative example) was applied in a 50 μm thickness on the upper surface of a sealing-molded package for shield evaluation having a 50Ω resistor on its substrate by screen printing, followed by curing, to obtain a magnetic film. Thereafter, a dicer was used to individuate the substrate to expose a ground pattern to the side surface of the substrate. Then, electroless plating was performed to form a metal film composed of a laminated film of Cu (film thickness of 1 μm) and Ni (film thickness of 2 μm) on the upper and side surfaces of the magnetic film and the side surface of the substrate so as to contact the ground pattern, whereby a noise attenuation measuring sample A3 was obtained.

On the other hand, a noise attenuation measuring sample B3 was produced by the same method as that for the noise attenuation measuring sample A3 except that the composite magnetic paste B (example) was used.

Further, noise attenuation measuring samples A4 and B4 were produced by the same methods as those for the respective noise attenuation measuring samples A3 and B3 except that a step of polishing the surface of the magnetic film was added before formation of the metal film. Conditions under which the surface of the magnetic film is polished are the same as those for the above surface resistance measuring samples A2 and B2.

The noise attenuation measuring samples A3, A4, B3, and B4 were connected to a signal generator, and a signal of an arbitrary frequency was transmitted to the 50Ω resistor, whereby an amount of noise emitted from each sample was measured by using a neighboring magnetic field measuring apparatus. On the other hand, a reference sample having no magnetic film and no metal film was previously produced, and a noise amount emitted from the reference sample was measured. Then, a difference between the noise amount in the reference sample and the noise amount in each of the samples A3, A4, B3, and B4 was calculated as a noise attenuation amount. Measurement results are shown in Table 2. The unit of numerical values is dBuV.

TABLE 2

| | Sample | | | |
|---|---|---|---|---|
| | A3 | A4 | B3 | B4 |
| noise attenuation amount (20 MHz) | 17 | 14 | 24 | 22 |
| noise attenuation amount (50 MHz) | 23 | 24 | 30 | 36 |
| noise attenuation amount (100 MHz) | 29 | 30 | 36 | 34 |

As shown in Table 2, the noise attenuation amount is larger in the noise attenuation measuring samples B3 and B4 that use the composite magnetic paste B (example) than in the noise attenuation measuring samples A3 and A4 that use the composite magnetic paste A (comparative example) at any frequency band. The surface resistance of each of the noise attenuation measuring samples A3 and A4 that use the composite magnetic paste A (comparative example) is less than $10^6\Omega$, and the surface resistance of each of the noise attenuation measuring samples B3 and B4 that use the composite magnetic paste B (example) is equal to or larger than $10^6\Omega$, so that it is confirmed that high shielding characteristics can be obtained by setting the surface resistance of the magnetic film equal to or larger than $10^6\Omega$.

What is claimed is:

1. An electronic circuit package comprising:
   a substrate having a power supply pattern;
   an electronic component mounted on a front surface of the substrate;
   a molding resin that covers the front surface of the substrate so as to embed the electronic component therein;
   a magnetic film provided in contact with at least an upper surface of the mold resin; and
   a metal film connected to the power supply pattern, the metal film covering the mold resin with an intervention of the magnetic film and covering a side surface of the magnetic film without an intervention of the mold resin,
   wherein a resistance value at an interface between the magnetic film and the metal film is equal to or larger than 106 W,
   wherein at least a part of a side surface of the substrate has a portion where the power supply pattern exposes without being covered with the magnetic film, and
   wherein the metal film contacts to the power supply pattern exposed to the side surface of the substrate.

2. The electronic circuit package as claimed in claim 1, wherein the metal film further covers a side surface of the molding resin.

3. The electronic circuit package as claimed in claim 1, further comprising an insulating material interposed between the magnetic film and the metal film.

4. The electronic circuit package as claimed in claim 1, wherein the magnetic film is a film formed of a composite magnetic material in which magnetic fillers are dispersed in a thermosetting resin material.

5. The electronic circuit package as claimed in claim 4, wherein the magnetic filler is formed of a ferrite or a soft magnetic metal.

6. The electronic circuit package as claimed in claim 5, wherein a surface of the magnetic filler is insulation-coated.

7. The electronic circuit package as claimed in claim 1, wherein the magnetic film is a thin film, a foil, or a bulk sheet formed of a soft magnetic material or a ferrite.

8. The electronic circuit package as claimed in claim 1, wherein the metal film is mainly composed of at least one metal selected from a group consisting of Au, Ag, Cu, and Al.

9. The electronic circuit package as claimed in claim 1, wherein the surface of the metal film is covered with an antioxidant film.

* * * * *

UNITED STATES PATENT AND TRADEMARK OFFICE
CERTIFICATE OF CORRECTION

PATENT NO. : 9,953,932 B2
APPLICATION NO. : 15/465177
DATED : April 24, 2018
INVENTOR(S) : Kenichi Kawabata et al.

It is certified that error appears in the above-identified patent and that said Letters Patent is hereby corrected as shown below:

In the Claims

Please correct the first wherein clause of Claim 1, such that the claim recites:
1. An electronic circuit package comprising:
   a substrate having a power supply pattern;
   an electronic component mounted on a front surface of the substrate;
   a molding resin that covers the front surface of the substrate so as to embed the electronic component therein;
   a magnetic film provided in contact with at least an upper surface of the mold resin; and
   a metal film connected to the power supply pattern, the metal film covering the mold resin with an intervention of the magnetic film and covering a side surface of the magnetic film without an intervention of the mold resin,
   wherein a resistance value at an interface between the magnetic film and the metal film is equal to or larger than $10^6 \Omega$,
   wherein at least a part of a side surface of the substrate has a portion where the power supply pattern exposes without being covered with the magnetic film, and
   wherein the metal film contacts to the power supply pattern exposed to the side surface of the substrate.

Signed and Sealed this
Ninth Day of October, 2018

Andrei Iancu
*Director of the United States Patent and Trademark Office*